United States Patent
Mann et al.

(10) Patent No.: US 6,894,834 B2
(45) Date of Patent: May 17, 2005

(54) OBJECTIVE WITH PUPIL OBSCURATION

(75) Inventors: Hans-Jürgen Mann, Oberkochen (DE); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/723,600

(22) Filed: Nov. 21, 2003

(65) Prior Publication Data

US 2004/0114217 A1 Jun. 17, 2004

Related U.S. Application Data

(63) Continuation of application No. PCT/EP02/09153, filed on Aug. 16, 2002.

(30) Foreign Application Priority Data

Aug. 16, 2001 (DE) .......................................... 101 39 177

(51) Int. Cl.⁷ ............................. G02B 23/00; G02B 5/08
(52) U.S. Cl. ........................ 359/366; 359/359; 359/859; 355/71
(58) Field of Search ................................. 359/350–366, 359/725–732, 850–861; 355/45–78

(56) References Cited

U.S. PATENT DOCUMENTS

| | | | | |
|---|---|---|---|---|
| 2,995,973 A | * | 8/1961 | Bowling et al. | ............. 356/331 |
| 4,861,148 A | * | 8/1989 | Sato et al. | .................... 359/366 |
| 4,863,253 A | | 9/1989 | Shafer et al. | ............... 359/350 |
| 5,003,567 A | | 3/1991 | Hawryluk et al. | ............. 328/34 |
| 5,212,588 A | | 5/1993 | Viswanathan et al. | ....... 359/355 |
| 5,309,541 A | * | 5/1994 | Flint | ........................... 385/133 |
| 5,523,193 A | | 6/1996 | Nelson | ....................... 430/311 |
| 5,691,541 A | | 11/1997 | Ceglio et al. | ............. 250/492.1 |
| 5,815,310 A | * | 9/1998 | Williamson | ................... 359/365 |
| 5,870,176 A | | 2/1999 | Sweatt et al. | ................ 355/53 |
| 6,060,224 A | | 5/2000 | Sweatt et al. | ............... 430/395 |
| 6,353,470 B1 | * | 3/2002 | Dinger | ........................ 355/71 |

FOREIGN PATENT DOCUMENTS

| | | |
|---|---|---|
| DE | 197 31 291 C2 | 1/1998 |
| EP | 0 267 766 A2 | 5/1988 |
| EP | 1 093 021 A2 | 4/2001 |

OTHER PUBLICATIONS

Gil Moretto, Thomas A. et al; "Asplanatic corrector design for the extremely large telescope"; Applied Optics, Jun. 1, 2000; vol. 39, No. 16, pp. 2805–2812.

Jungquist, Robert K.; "Optical design of the Hobby–Eberly Telescope Four Mirror Spherical Abberation Corrector"; SPIE vol. 3779, 2–16, Jul. 1999.

Mignardi, Michael A.; "Digital micromirror array for projection TV"; Solid State Technology, Jul. 1994, pp. 63–68.

* cited by examiner

Primary Examiner—Thong Q Nguyen
(74) Attorney, Agent, or Firm—Darby & Darby

(57) ABSTRACT

An objective is configured with a first partial objective and a second partial objective. The first partial objective, which projects a first field plane onto an intermediate image, has a first, convex mirror and a second, concave mirror. The second partial objective, which projects the intermediate image onto a second field plane, has a third and a fourth mirror, both concave. All of the four mirrors have central mirror apertures. The axial distance between the first and second mirrors is in a ratio between 0.95 and 1.05 relative to the distance between the second mirror and the intermediate image. The axial distance $Z_{M3-IM}$ between the third mirror and the second field plane conforms to the relationship $$0.03 \cdot Du_{M3} + 5.0 \text{ mm} < Z_{M3-IM} < \frac{0.25 \cdot Du_{M3}}{\tan(\arcsin(NA))}.$$

NA represents the numerical aperture NA in the second field plane, and $Du_{M3}$ represents the diameter of the third mirror. The objective furthermore has a Petzval radius with an absolute value larger than the distance between the first and second field planes.

47 Claims, 9 Drawing Sheets

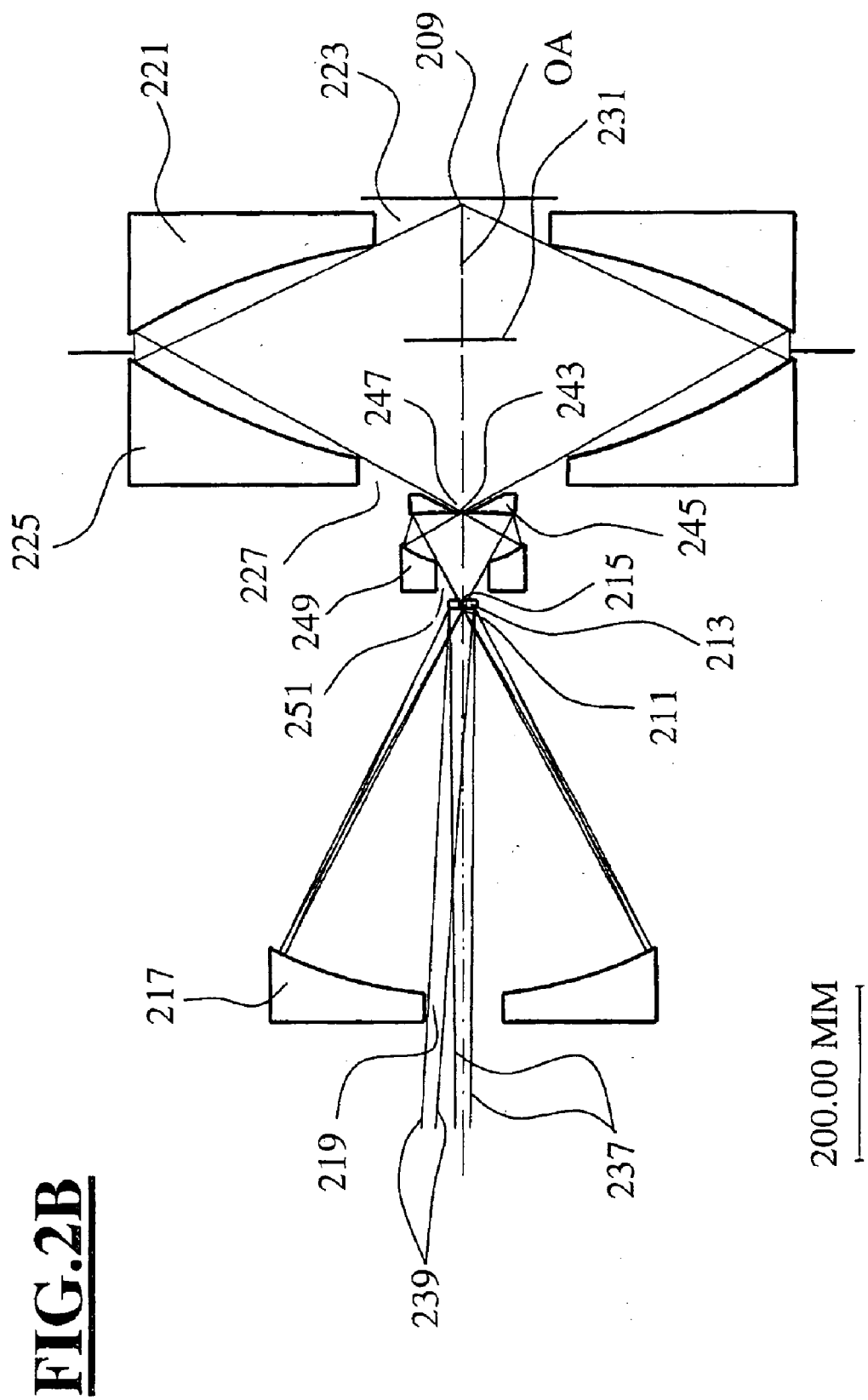

OBJECTIVE WITH PUPIL OBSCURATION

CROSS REFERENCE TO RELATED APPLICATIONS

This application is a continuation of International Application Serial No. PCT/EP02/09153, filed Aug. 16, 2002 and published in English on Feb. 27, 2003, which is still pending, and which claims priority from German Patent Application No. 101 39 177.3, filed Aug. 16, 2001, all of which are hereby incorporated by reference in their entirety.

BACKGROUND OF THE INVENTION

The invention relates to an objective with mirrors whose central mirror apertures cause a pupil obscuration. An objective of the type considered herein comprises two partial objectives, the first partial objective projecting a first field plane onto an intermediate image, and the second partial objective projecting the intermediate image onto a second field plane. Such objectives are used, for example, as projection objectives in microlithography or as inspection objectives for observing surfaces, in particular wafer surfaces.

Catoptric reduction objectives with a pupil obscuration and intermediate image for application in microlithographic projection exposure apparatus are disclosed in EP 0 267 766 A2. The exemplary embodiments shown in FIG. 2 and FIG. 3 of EP 0 267 766 A2 represent objectives with a first partial objective and a second partial objective. The two partial objectives in the case of FIGS. 2 and 3 constitute two mutually opposing quasi-Schwarzschild objectives with different magnification ratios. The quasi-Schwarzschild objectives are constructed from a convex and a concave mirror which in each case have a central mirror aperture. In the case of the objectives shown there, the aperture obscuration of 0.38 or 0.33 is relatively large by comparison with the image-side numerical aperture of 0.3. Moreover, the objectives have only a magnification ratio of 0.6 or of 0.4. The numerical aperture at the intermediate image is greater than in the image plane due to the configuration of the two mutually opposing quasi-Schwarzschild objectives.

A reflective projection objective for EUV (Extreme Ultraviolet) lithography with pupil obscuration, but without an intermediate image, is disclosed in U.S. Pat. No. 5,212,588. The projection objective comprises a convex mirror with a central mirror aperture, and a concave mirror with a central mirror aperture. The rays emanating from the object plane are reflected four times at the two mirrors before they strike the image plane. The image-side numerical aperture is only between 0.08 and. 0.3 in the case of an aperture obscuration of between 0.4 and 0.7. The magnification ratio in the exemplary embodiments is between −0.3 and −0.2.

A further reflective projection objective for EUV lithography with pupil obscuration, but without an intermediate image, is disclosed in U.S. Pat. No. 5,003,567. In this case, the projection objective comprises a pair of spherical mirrors which are coated with multilayers and have a common center of curvature. In this case, the first mirror is a convex mirror, while the second mirror is a concave mirror. However, these objectives of the Schwarzschild type have a large image field curvature, and U.S. Pat. No. 5,003,567 therefore proposes applying the structure-carrying mask (reticle) to a curved substrate.

Reflective projection objectives for EUV lithography with pupil obscuration and intermediate image are also disclosed in EP 1 093 021 A2. The first partial objective, arranged between the object plane and the intermediate image, has four or six mirrors which are inserted extra-axially except for the mirror arranged in the aperture plane. The first partial objective does not lead to pupil obscuration in this case. The second partial objective comprises a convex mirror with an extra-axial mirror aperture, and a concave mirror with an extra-axial mirror aperture. The mirror which lies geometrically closest to the image plane is a convex mirror, and accordingly the thickness of the mirror substrate is greatest on the optical axis. This leads to a greater aperture obscuration when the free image-side working distance and the substrate thickness of the convex mirror are considered. In addition, convex mirrors generally have a lesser diameter than concave mirrors, since they have a diverging optical power. However, in the case of a lesser mirror diameter, the mirror obscuration, that is to say the ratio of the diameter of the mirror aperture to the diameter of the mirror, is more unfavorable.

A catoptric microscope objective with pupil obscuration, but without an intermediate image, is disclosed in U.S. Pat. No. 4,863,253. It comprises a convex mirror without a central mirror aperture, and a concave mirror with a central mirror aperture. In this arrangement, after reflection at the concave mirror the rays do not pass through a mirror aperture in the convex mirror, but are guided past the first mirror on the outside. This leads to a very high aperture obscuration by the convex mirror.

The publication entitled "Aplanatic corrector designs for the extremely large telescope" by Gil Moretto (Applied Optics; Vol. 39, No. 16; 1 Jun. 2000; 2805–2812) discloses a mirror telescope which has, downstream of a spherical primary mirror, a correction objective which corrects the spherical aberration and coma caused by the primary mirror. In this case, the correction objective projects the intermediate image formed by the primary mirror onto the image plane of the telescope enlarged with a magnification ratio of 3.5. The objective comprises two concave mirrors which project the intermediate image onto a further intermediate image, and a pair of mirrors composed of a concave mirror and a convex mirror which project the further intermediate image onto the image plane of the telescope. The projection of the intermediate image formed by the primary mirror onto the further intermediate image has a reduction ratio of −0.9, while the projection of the further intermediate image onto the image plane of the telescope is enlarged with a magnification ratio of −3.75. The numerical aperture is 0.1 at the image plane of the telescope and 0.345 at the intermediate image. Because of the mirror apertures, the objective has a pupil obscuration which is relatively large by comparison with the numerical aperture. The correction objective also has a relatively large field curvature, since the convex mirror has only a slight curvature.

A correction objective for a telescope is also disclosed in the publication entitled "Optical design of the Hobby-Eberly Telescope Four Mirror Spherical Aberration Corrector" by R. K. Jungquist (SPIE Vol. 3779, 2–16, Jul. 1999). The optical design is very similar to the previously described correction objective. It is exclusively concave mirrors that are used in the correction objective shown, and so the field curvature is relatively large.

Controllable micromirror arrays are disclosed in the publication entitled "Digital Micromirror Array for Projection TV" by M. A. Mignard (Solid State Technology, July 1994, pp. 63–68). Their use as object to be projected in projection exposure apparatus forms the content of U.S. Pat. No. 5,523,193, U.S. Pat. No. 5,691,541, U.S. Pat. No. 6,060,224 and U.S. Pat. No. 5,870,176. In the exemplary embodiments described there, the respective projection objective is, however, illustrated only diagrammatically. Concrete exemplary embodiments for projection objectives which are adapted to the requirements of so-called maskless lithography are not contained in the patents.

A catadioptric projection objective with pupil obscuration and intermediate image is disclosed in DE 197 31 291 C2. In this case, the objective has a refractive and a catadioptric partial objective, and is used in a wide UV wavelength region. In addition to lenses for color correction, a concave mirror and an approximately plane mirror are arranged in the catadioptric partial objective. Because of the use of lenses, it is not possible to use this objective in the case of EUV wavelengths (<20 nm). The projection objective is used, for example, in an inspection system for observing wafer surfaces.

OBJECT OF THE INVENTION

It is an object of the invention to improve projecting objectives with pupil obscuration, in particular to reduce the aperture obscuration.

SUMMARY OF THE INVENTION

A projection objective that meets the foregoing object of the invention comprises a first partial objective and a second partial objective which are arranged along an optical axis.

The first partial objective, which comprises a first convex mirror with a first central mirror aperture and a second concave mirror with a second central mirror aperture, projects a first field plane onto an intermediate image. Light rays which emanate from the first field plane first pass through the second mirror aperture, are then reflected at the first mirror, next reflected at the second mirror, and then pass through the first mirror aperture. Since the diameter of the second mirror aperture is decisively determined by the diameter of the first mirror, it is advantageous for the purpose of reducing the aperture obscuration to provide the first mirror as convex mirror and the second mirror as concave mirror so that the first mirror has a substantially lesser diameter than the second mirror.

The first mirror and the second mirror are arranged at a first axial distance from each other. If not otherwise stated, in this application the axial distance between two mirrors is determined between the surface vertices of the two mirrors. In the case of mirrors with central mirror apertures, the surface vertex specifies the point on the optical axis at which the mirror surface would intersect the optical axis if the mirror had no mirror aperture. The second mirror has a second axial distance from the intermediate image. The location of the intermediate image is given by the paraxial position of the intermediate image. In order to keep the aperture obscuration as low as possible, the ratio of first axial distance to second axial distance has a value of between 0.95 and 1.05, in particular between 0.98 and 1.02. In this case, the intermediate image is located at least approximately at the location of the first mirror. Since the diameter of a ray pencil is minimal in field planes, and the pencil diameter is determined by the diameter of a mirror aperture on the other hand, it is advantageous to place the intermediate image as close as possible to the location of the first mirror. The intermediate image can therefore also be located, for example, between the first mirror and the second mirror, at the surface vertex of the first mirror or downstream of the surface vertex of the first mirror in the direction of the light, in which case the axial distances should conform to the above-mentioned condition.

The intermediate image is projected onto a second field plane by means of the second partial objective. This has the purpose of providing between the optical components of the second partial objective and the second field plane a sufficiently large free optical working distance, which does not exist between the intermediate image and the optical components of the first partial objective. The second partial objective has a third concave mirror with a third central mirror aperture and a fourth concave mirror with a fourth central mirror aperture, which are arranged facing one another. In this case, light rays first pass through the fourth mirror aperture, are reflected at the third mirror, are subsequently reflected at the fourth mirror, and then pass through the third mirror aperture. In order to keep the aperture obscuration as low as possible, the third mirror is arranged as close to the second field plane as is allowed by the free optical working distance. In addition, the third mirror is a concave mirror with a relatively large diameter, and thus the ratio of the diameter of the mirror aperture to the diameter of the mirror assumes smaller values. The axial distance between the third mirror and the second field plane is denoted below by $ZM_{M3-IM}$. The distance $Z_{M3-IM}$ advantageously has a minimum value which is equal to the sum of the minimum substrate thickness of the third mirror and a minimum free optical working distance. The minimum substrate thickness is specified on the optical axis between the surface vertex and the rear surface even if, because of the central mirror aperture, the mirror has no substrate material there. The minimum substrate thickness is 3% of the diameter of the mirror. Since it is a concave mirror, the physically present substrate thickness of the third mirror is greater. If the aperture obscuration so permits, it is advantageous when the minimum substrate thickness on the axis is 5% or even 10% of the diameter of a concave mirror with central mirror aperture. The minimum free optical working distance between the rear surface of the third mirror and the second field plane is 5.0 mm. This free optical working distance ensures the positioning of an object in the second field plane. The maximum value of the distance $ZM_{M3-IM}$ is primarily a function of the tolerable aperture obscuration and secondly of the numerical aperture NA in the second field plane. It is advantageous for a low aperture obscuration when the diameter of the third mirror aperture is smaller than 50% of the diameter DuM3 of the third mirror. Since the diameter of the third mirror aperture increases linearly with the tangent of the arcsine of the numerical aperture in the second field plane, and with the distance of the third mirror from the field plane, the maximum value of the distance $Z_{M3-IM}$ is given by the following relationship.

$$Z_{M3-IM}^{\max} = \frac{0.25 \cdot Du_{M3}}{\tan(\arcsin(NA))}.$$

In order to be able to use the objective for projecting an extended object onto an image in a projection exposure apparatus or in an inspection system, for example, the field curvature of the objective should be corrected as well as possible. The objective advantageously has a Petzval radius whose absolute value is greater than the axial distance between the first and second field planes. In order to compensate for the positive contributions of the concave mirrors to the Petzval sum, the first convex mirror supplies a large negative contribution. Since the first convex mirror therefore has a large negative optical power and thus, by comparison with the concave mirrors, a small diameter, this mirror is particularly critical with regard to its contribution to the aperture obscuration. However, since it is arranged at least approximately at the location of the intermediate image, the objective has a low aperture obscuration despite a good Petzval correction.

DETAILED CONCEPTUAL DESCRIPTION OF PREFERRED EMBODIMENTS

Only light rays with aperture angles starting from a specific minimum value contribute to the projection in this objective with pupil obscuration. The aperture angles are measured with reference to the optical axis. The minimum aperture angle results for the light ray which is still transmitted by all mirrors and not vignetted by a mirror aperture. The light rays are not directly vignetted by the mirror apertures, but pass as false light through the latter and strike a special light blocking device, while the remaining rays of a ray pencil with larger aperture angles are reflected by the mirrors. The aperture obscuration is defined as the ratio of the sine of the minimum aperture angle in the second field plane to the numerical aperture in the second field plane. Values of less than 0.6, in particular less than 0.5, can be achieved for the aperture obscuration by means of the arrangement of the intermediate image in the vicinity of the first mirror, and with the use of a concave mirror in the vicinity of the second field plane.

In addition to a low aperture obscuration, a large value for the ratio of the numerical aperture in the second field plane to the aperture obscuration is also an important feature of the objective. The larger the numerical aperture of the objective in the second field plane, the more difficult it is to achieve a low aperture obscuration. The objective is distinguished in that this ratio is greater than 1.2, in particular greater than 1.5.

The numerical aperture in the second field plane is greater than 0.3, in particular greater than 0.4, with particular preference greater than 0.6.

Between the first field plane and the second field plane, the objective has an imaging ratio of greater than 4:1, in particular greater than 10:1, with particular preference greater than 20:1. Imaging ratio s of between 4:1 and 10:1 are typical for projection objectives for lithography. Imaging ratio s of greater than 20:1 are of interest, for example, for microscope objectives, inspection objectives or projection objectives which project a controllable micromirror array onto a photosensitive substrate. In this context, the imaging ratio between two conjugated field planes is defined as the absolute value of the ratio between an object height and an image height, wherein the magnification ratio between two conjugated field planes is defined as the ratio between an image height and an object height, having e.g. a positive sign for an upright image and a negative sign for an inverted image.

Since the objective comprises two partial objectives, it is advantageous when both the imaging ratio between the first field plane and the second field plane and also the imaging ratio between the intermediate image and the second field plane are greater than 1:1, in particular greater than 1.1:1. As a result, the numerical aperture between the first field plane and the second field plane is increased step-by-step. The maximum numerical aperture therefore does not occur until in the second field plane.

In order to keep the aperture obscuration as low as possible, it is advantageous if, between the first field plane and the intermediate image, the first partial objective has an imaging ratio which is substantially greater by comparison with the second partial objective. Thus, this imaging ratio should be greater than 3:1, in particular greater than 5:1, with particular preference greater than 10:1.

Due to the negative optical power of the first mirror, it is possible to make the diameter of the second mirror substantially larger than the diameter of the first mirror. The ratio of the diameter of the second mirror to the diameter of the first mirror should be greater than 3:1, in particular greater than 5:1. Since the diameter of the mirror aperture of the second mirror is approximately equal to the diameter of the first mirror, the second mirror leads only to a low aperture obscuration, or to no increase in the aperture obscuration, which is caused by the other mirrors.

Since the pencil cross section of the light rays is smallest in the region of the intermediate image, and thus also in the region of the first mirror, it is advantageous to arrange the fourth mirror in the region of the intermediate image, or in the region of the first mirror. The axial distance between the fourth mirror and the first mirror should be less than 10% of the axial distance of the first field plane from the second field plane. Unless otherwise stated, dimensions in this application are given not in absolute terms, but are stated as ratios relative to the axial distance between the first and second field planes, since all dimensions can be scaled up or down proportionally with this distance. In this case, it can be advantageous to arrange the first mirror in the mirror aperture of the fourth mirror. The two mirrors can also have the same mirror substrate, with the mirror surface of the first mirror on the front surface of the mirror substrate, and the mirror surface of the fourth mirror on the rear surface of the mirror substrate.

In an advantageous embodiment, the previously described features are achieved with only four mirrors.

In order to be able to increase the numerical aperture between the first field plane and the second field plane in two steps, a further intermediate image is advantageously arranged between the intermediate image and the second field plane. For this purpose, a fifth mirror with a fifth central mirror aperture and a sixth mirror with a sixth central mirror aperture are arranged optically between the intermediate image and the further intermediate image. The light rays first pass through the sixth mirror aperture, are reflected at the fifth mirror, are reflected at the sixth mirror, and then pass through the fifth mirror aperture. The third mirror and the fourth mirror are located optically between the further intermediate image and the second field plane. The second partial objective therefore has two subsystems, the first-subsystem comprising the optical components between the intermediate image and the further intermediate image, in particular the fifth mirror and the sixth mirror, and the second subsystem comprising the optical components between the further intermediate image and the second field plane, in particular the third mirror and the fourth mirror.

When the fifth mirror and the sixth mirror are concave mirrors, they can have relatively large diameters by comparison with the mirror apertures. Thus, they worsen the aperture obscuration only slightly, if at all. As concave mirrors, they are arranged facing one another.

As an alternative possibility, the fifth mirror can be a convex mirror and the sixth mirror a concave mirror. In this case, the fifth mirror and the sixth mirror have an arrangement similar to the first mirror and the second mirror.

In order for the ray pencil coming from the sixth mirror to have a small ray diameter at the fifth mirror, and thus also for the fifth mirror aperture to have only a small diameter, it is advantageous if the distance of the further intermediate image from the fifth mirror is less than 5% of the axial distance of the first field plane from the second field plane.

Since the numerical aperture at the intermediate image is substantially greater than in the first field plane, the sixth mirror should be arranged close to the intermediate image, or close to the first mirror. The axial distance of the sixth mirror from the first mirror is advantageously less than 10% of the axial distance of the first field plane from the second field plane.

For the same reason, the fourth mirror should be arranged close to the further intermediate image, or close to the fifth mirror. The axial distance of the fourth mirror and the fifth mirror is advantageously less than 10% of the axial distance of the first field plane from the second field plane.

With the arrangement of at least six mirrors, in particular exactly six mirrors, it is possible to achieve in the second field plane a numerical aperture greater than 0.6, in particular greater than 0.8 in conjunction with an aperture obscuration of less than 0.5.

If the object to be projected is a reflective object, the illuminating light must be introduced between the first field plane and the optical components of the first partial objective. Precisely in the case of EUV wavelengths of less than 20 nm, it is advantageous to use a so-called grazing-incidence mirror to introduce the illuminating light, where the angle of incidence for the light rays is more than 70° (measured from the normal vector of the mirror surface). A sufficiently large free working distance upstream of the first field plane is, however, necessary for such mirrors. This free working distance is advantageously greater than 20% of the axial distance between the first and second field planes.

With the objective of the foregoing description, it is possible to correct the projection for a field with a diameter of greater than 1.0 mm in the second field plane.

In particular, the ratio between the spherical aberration and the axial distance between the first and second field planes is less than $10^{-5}$. The value of the spherical aberration represents the third-order spherical aberration according to the Seidel theory, i.e., the lateral aberration as calculated, for example, by the commercially available optical design software CodeV.

To use the objective as a projection objective or as an inspection objective, it is advantageous if the axial distance of the first field plane from the second field plane is at most 3000 mm.

If the objective has only mirrors, its application is not limited to a specific range of wavelengths. Rather, it is possible by means of an appropriate coating of the mirrors to adapt the objective to the wavelength that is being used. The objective can also be used simultaneously at two separated operating wavelengths if the reflective coatings allow this. In the case of projection objectives of a lithographic projection exposure apparatus, the projection can be performed, for example, at a first wavelength, and the alignment of structure-carrying mask (reticle) and photosensitive substrate (wafer) can be performed at a second wavelength. It is advantageous to use the objective at wavelengths of less than 200 nm, since in the case of these wavelengths only a few transparent materials such as, for example, fluoride crystals are available. The use of mirrors is mandatory in the case of wavelengths of less than 20 nm. At an operating wavelength of approximately 11 nm–13 nm, for example, mirrors with reflective multilayer coatings of molybdenum and silicon, or molybdenum and beryllium are used.

The application of the concept is not limited to purely reflective objectives. It is also possible to arrange lenses between the individual mirrors, particularly in the region of the field planes and in the region of an intermediate image. These lenses can be used, for example, to perform the color correction or to set the telecentricity.

In a preferred embodiment, the objective has a magnification ratio with an absolute value of less than 1.0. In this case, the projection of an object in the first field plane produces a reduced image in the second field plane.

Such objectives are used, for example, as projection objectives in lithographic projection exposure apparatus. In a lithographic projection exposure apparatus, an illuminating system illuminates a structure-carrying mask (reticle) which is projected by the projection objective onto a photosensitive substrate.

Such lithographic projection exposure apparatus are adequately known from the prior art, being disclosed, for example, for EUV lithography in U.S. Pat. No. 5,212,588, U.S. Pat. No. 5,003,567 or EP 1 093 021 A2, whose content is incorporated herein by reference.

Microstructured semiconductor components are fabricated in a multiplicity of individual, very complex method steps. An important method step relates to the exposure of photosensitive substrates (wafers), for example silicon substrates provided with photoresist. In this case, the reticular structure of the mask is projected onto the wafer by the projection objective during fabrication of a single so-called layer.

It is also possible to use a controllable micromirror array instead of a reticle in a lithographic projection exposure apparatus. Such lithographic projection exposure apparatus are adequately known from the prior art, being disclosed, for example, in U.S. Pat. No. 5,523,193, U.S. Pat. No. 5,691,541, U.S. Pat. No. 6,060,224 and U.S. Pat. No. 5,870,176, whose content is incorporated herein by reference. Since the previously described objectives permit an imaging ratio of greater than 20:1 between the controllable micromirror array and a photosensitive substrate, the images of the individual micromirrors, whose size is of the order 1 $\mu$m, have dimensions of less that 50 nm. Consequently, controllable micromirror arrays also are of interest for microlithography, since it is possible to implement resolutions of less than 100 nm.

In the fabrication of a single layer of a micro-structured semiconductor component, the positions of the micromirrors are controlled in accordance with a prescribed pattern in such a way that only the ray pencils of those micromirrors which are to be projected are aimed into the entrance pupil of the objective. All other ray pencils are prevented from contributing to the projection by a suitable ray trap.

It should be noted that the objective according to the invention is not restricted to one sense of direction of the light path, but can also be used in an arrangement where the light rays emanate from the second field plane and a projected image is produced in the first field plane. In a preferred embodiment of this concept, the objective has a magnification ratio whose absolute value is greater than 1.0. In this case, an object arranged in the second field plane is projected into the first field plane to produce an enlarged image.

Such objectives are used, for example, as inspection objectives in an inspection system for observing a surface of an object. The surface of the object, in particular the surface of a wafer, is projected by the inspection objective with a large magnification ratio onto the entry surface of an observation unit. The inspection system has an illuminating system which illuminates the surface directly or through the inspection objective. In the latter case, the illuminating light is, for example, introduced into the projecting beam path between the entry surface of the observation unit and the inspection objective, or inside the inspection objective. The light reflected by the wafer surface is evaluated according to various criteria by means of the observation unit.

Such inspection systems are adequately known from the prior art, being disclosed, for example, for the UV wavelength region in DE 197 31 291 C2, whose content is incorporated herein by reference.

In addition to the application as projection objective or as inspection objective, the objective according to the invention can also be used in other optical arrangements where a diffraction-limited projection is to be achieved in conjunction with very large numerical apertures, particularly in the case of EUV wavelengths. Microscopy, in particular, offers a wide field of applications.

BRIEF DESCRIPTION OF THE DRAWINGS

A more detailed description of the invention follows below, making reference to the drawings, wherein:

FIG. 2B represents an enlarged detail of FIG. 2A;

DETAILED DESCRIPTION OF PREFERRED EMBODIMENTS

Figure 1A:
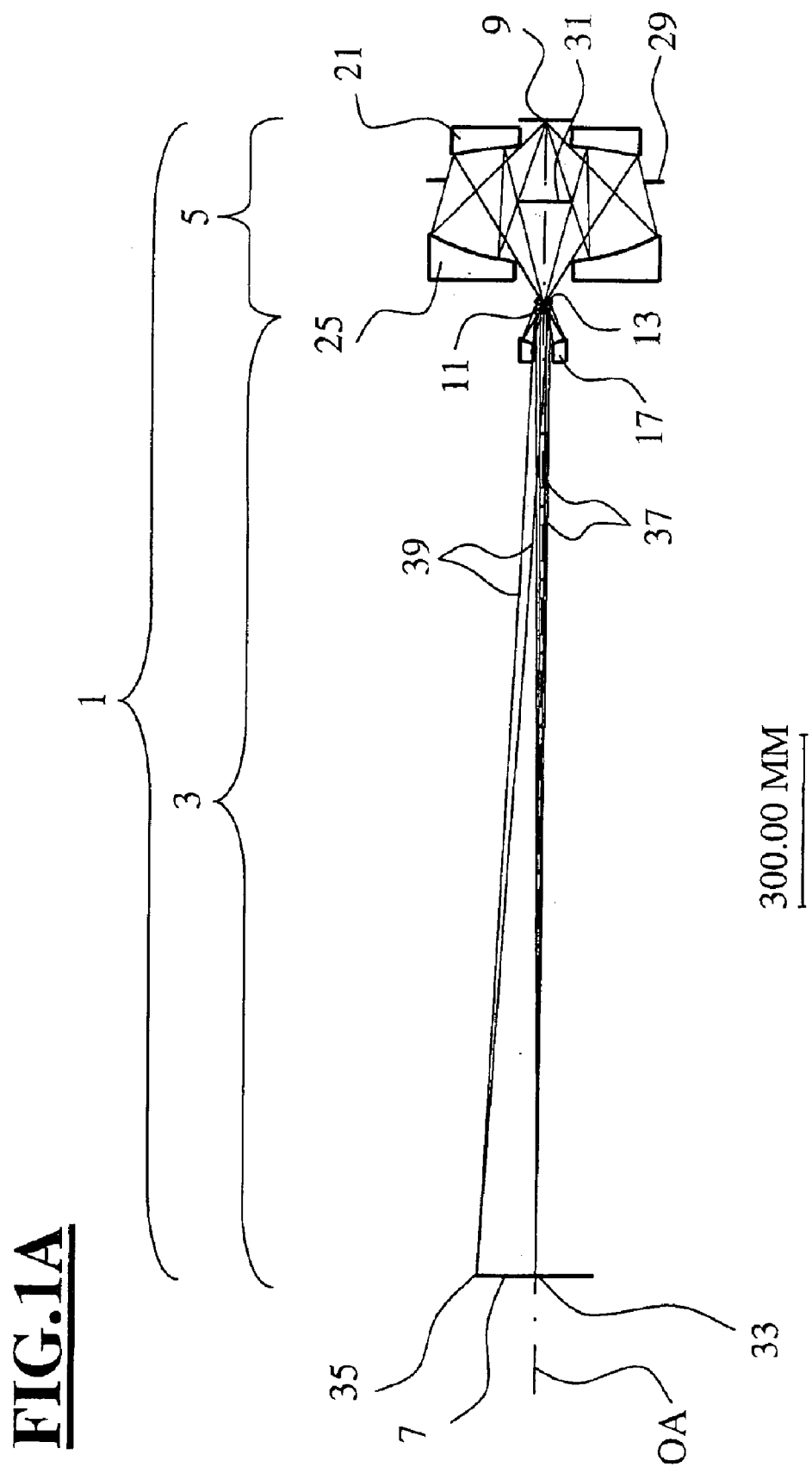
FIG. 1A represents a sectional view of a first exemplary embodiment of the invention.
Figure 1B:
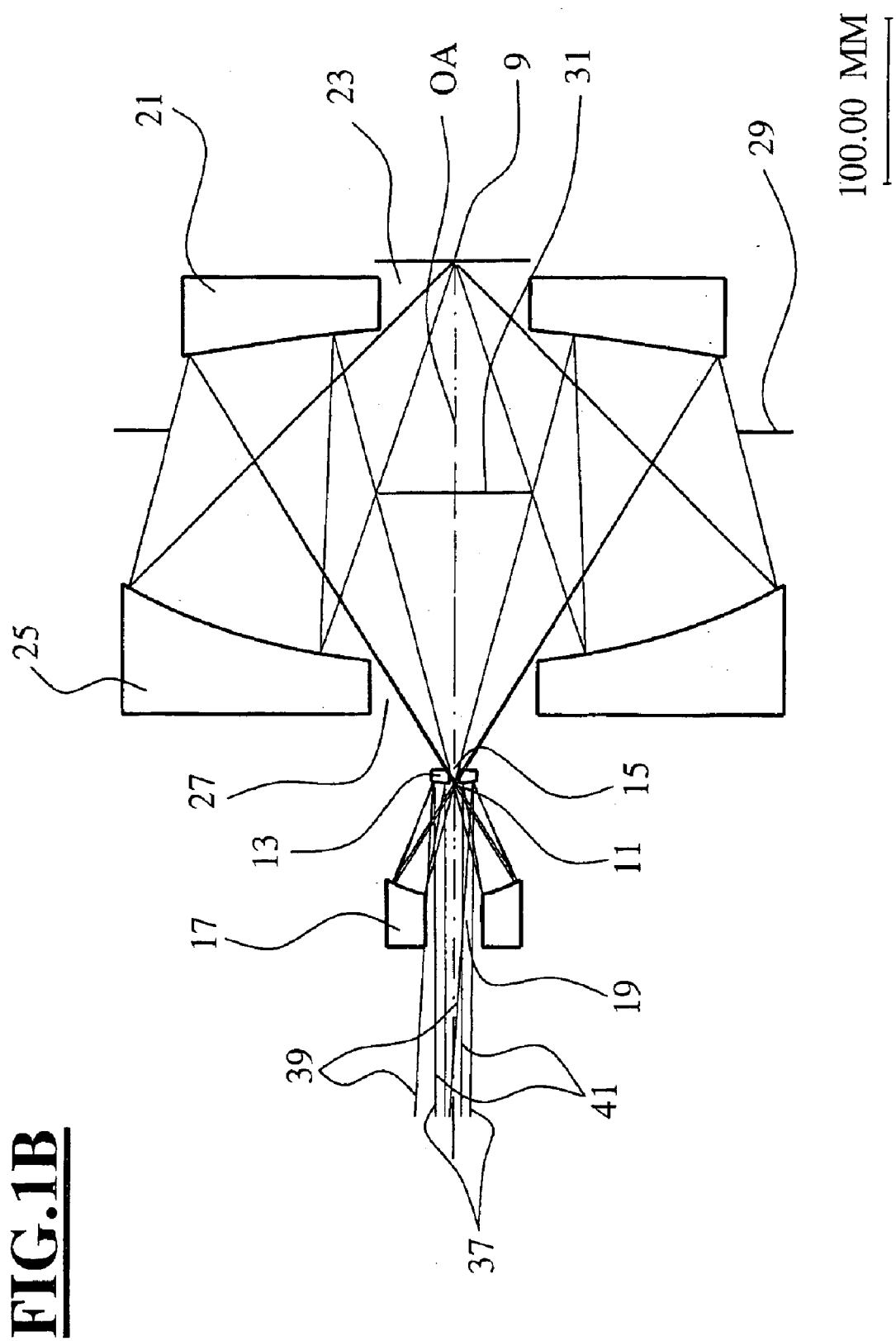
FIG. 1B represents an enlarged detail of FIG. 1A.

FIG. 1A illustrates a first exemplary embodiment for an objective 1 in accordance with the invention. A detail view without the large free working space on the object side is presented in FIG. 1B for the purpose of a clearer illustration. The optical data for the first exemplary embodiment are listed in Table 1 in the format of the optical design software CodeV.

The objective 1 comprises the first partial objective 3 and the second partial objective 5, which are centered about the optical axis OA. The objective 1 projects the first field plane 7 with an imaging ratio of 100:1 onto the second field plane 9. The numerical aperture NA in the second field plane 9 is 0.7. The diameter of the field in the second field plane 9 is 2 mm. The axial distance between the first field plane 7 and the second field plane 9 is 2000 mm.

The first partial objective 3 projects the first field plane 7 with an imaging ratio of 74:1 onto the intermediate image 11. It comprises the convex mirror 13 with the central mirror aperture 15, and the concave mirror 17 with the central mirror aperture 19. The concave mirror 17 is designed in such a way that the intermediate image 11 is formed in the vicinity of the convex mirror 13. The axial distance between the mirror 17 and the paraxial position of the intermediate image 11 is equal to the axial distance between the mirror 17 and the mirror 13 and is 68.8 mm. The ratio of the diameter of the concave mirror 17 to the diameter of the convex mirror 13 is 3.0:1. The free optical working distance between the first field plane 7 and the mirror 17 is 1580 mm, assuming a substrate thickness of 35.2 mm on the optical axis for the mirror 17.

The second partial objective 5 projects the intermediate image 11 onto the second field plane 9 with an imaging ratio of 1.35:1. It comprises the concave mirror 21 with the central mirror aperture 23, and the concave mirror 25 with the central mirror aperture 27. The mirror 21 is arranged close to the second field plane 9 and has an axial distance of 40.0 mm from this plane. The mirror 21 has a diameter of 315.8 mm. Consequently, it should have a substrate thickness of 9.5 mm, at least on the optical axis OA. The substrate thickness of the mirror 21 on the optical axis is 30 mm. The difference between the substrate thickness and the axial distance of the mirror 21 from the second field plane 9 represents the free optical working distance, which is 10.0 mm in the first exemplary embodiment; On the other hand, the mirror 21 is arranged so close to the second field plane 9 that the mirror obscuration is only 0.3 in the case of a numerical aperture NA=0.7 in the second field plane 9. The mirror obscuration is represented by the ratio of the diameter of the mirror aperture 23 to the diameter of the mirror 21. So that the concave mirror 25 does not worsen the aperture obscuration, it is arranged in the vicinity of the convex mirror 13, or of the intermediate image 11. The axial distance between the concave mirror 25 and the convex mirror 13 is 71.3 mm.

Located between the concave mirror 21 and the concave mirror 25 is the aperture plane 29 and the light blocking device 31, which is designed as a ray trap. The diameter of the light blocking device 31 is fixed in such a way that the ray pencils occurring in the second field plane 9 have an aperture obscuration almost independent of field height. If a mechanical shutter diaphragm with variable diameter is arranged in the aperture plane 29, the shutter blades can move on a curved surface in accordance with the curvature of the aperture plane. It is also possible to provide a plurality of flat mechanical diaphragms with variable diameter which can be inserted if required axially offset. The marginal rays 37 and 39, which emanate from the two field points 33 and 35 in the first field plane 7, go through the upper and lower margins of the aperture plane 29. The field point 33 is located on the optical axis OA, and the field point 35 is located on the upper margin of the field at a distance of 100 mm from the optical axis OA. Further illustrated for the field point 33 are the rays 41 which are just no longer vignetted by the mirror apertures. In the second field plane 9, they have an aperture angle of 18.40°, and so the aperture obscuration is 0.45. The ratio of the numerical aperture in the second field plane to the aperture obscuration is therefore 1.56. The mirror aperture 19 of the concave mirror 17 acts in a limiting fashion for the aperture obscuration in the first exemplary embodiment.

It was possible in the first exemplary embodiment largely to correct the field curvature by means of the negative optical power of the convex mirror 13. The Petzval radius is 192137 mm.

It was possible in the first exemplary embodiment to correct the third-order spherical aberration to a value of 0.6 µm.

Figure 2A:
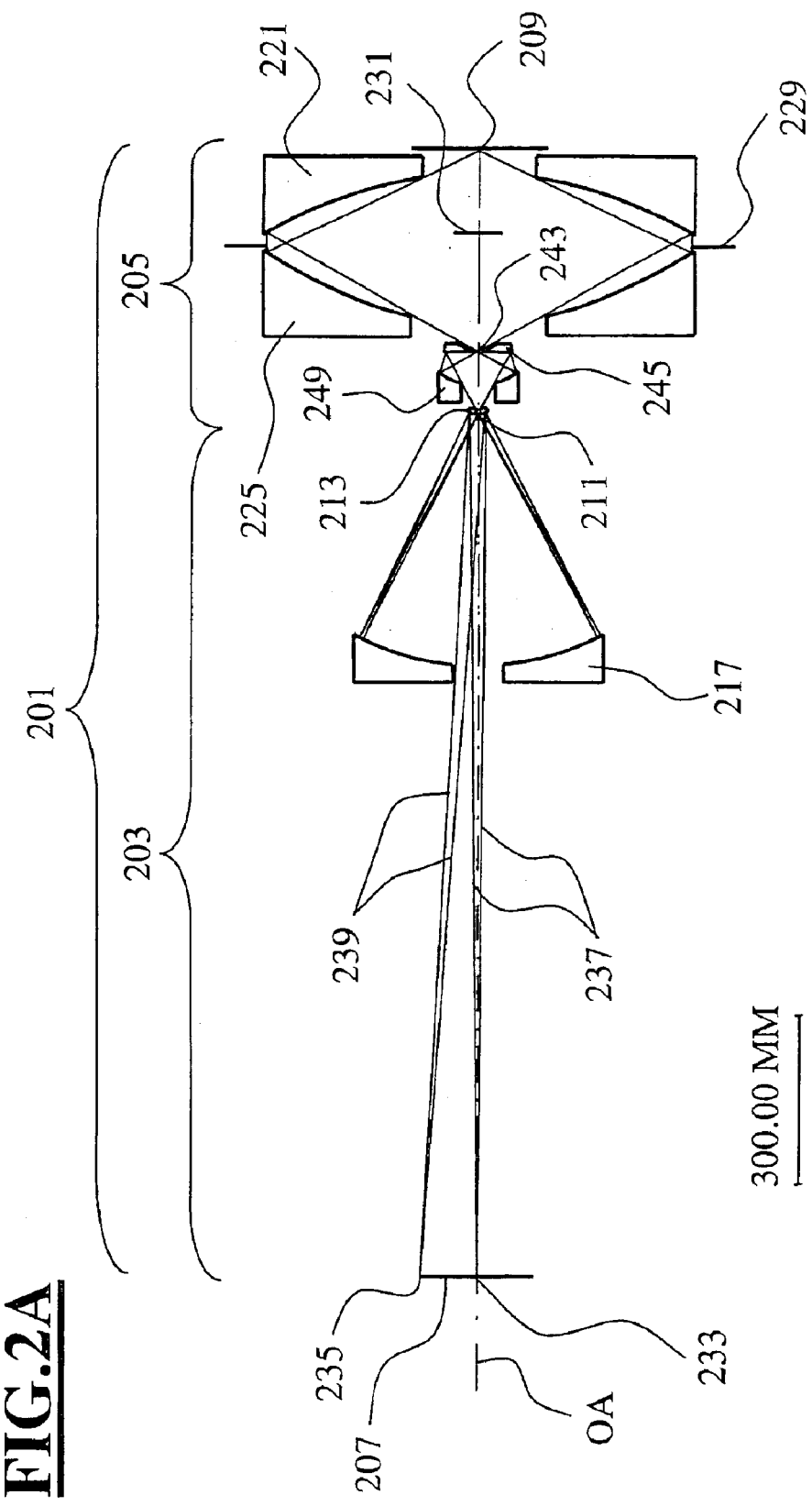
FIG. 2A represents a sectional view of a second exemplary embodiment of the invention.

A second exemplary embodiment of an objective 201 in accordance with the invention is illustrated in FIG. 2A. FIG. 2B shows a detail from FIG. 2A for the purpose of better illustration. The optical data for the second exemplary embodiment are specified in Table 2 in the format of the optical design software CodeV. The elements in FIGS. 2A/B which correspond to the elements of FIGS. 1A/B have the same reference symbols as in FIGS. 1A/B increased by the number 200. Reference is made to the description relating to FIGS. 1A/B for a description of these elements.

The objective 201 comprises the first partial objective 203 and the second partial objective 205, which are arranged centered about the optical axis OA. The objective 201 projects the first field plane 207 with an imaging ratio of 100:1 onto the second field plane 209. The numerical aperture NA in the second field plane 209 is 0.9. The diameter of the field in the second field plane 209 is 2 mm. The axial distance between the first field plane 207 and the second field plane 209 is 2000 mm.

The first partial objective 203 projects the first field plane 207 with an imaging ratio of 52:1 onto the intermediate image 211. It comprises the convex mirror 213 with the central mirror aperture 215, and the concave mirror 217 with the central mirror aperture 219. The concave mirror 217 is designed in such a way that the intermediate image 211 is formed in the vicinity of the convex mirror 213. The axial distance between the mirror 217 and the paraxial position of the intermediate image 211 is equal to the axial distance between the mirror 217 and the mirror 213 and is 447.5 mm. The ratio of the diameter of the concave mirror 217 to the diameter of the convex mirror 213 is 14.4:1. The free optical working distance between the first field plane 207 and the mirror 217 is 1050 mm, assuming a substrate thickness of 36.4 mm on the optical axis OA for the mirror 217.

The second partial objective 205 projects the intermediate image 211 onto the second field plane 209 with an imaging ratio of 1.9:1. The projection is performed via an intermediate projection of the intermediate image 211 onto the further intermediate image 243. The intermediate image 211 is projected by the concave mirror 245 with the central mirror aperture 247, and by the concave mirror 249 with the central mirror aperture 251, onto the further intermediate image 243 which is projected, in turn, by the concave mirror 221 with the central mirror aperture 223, and by the concave mirror 225 with the central mirror aperture 227, onto the second field plane 209. It is possible by means of this further intermediate projection to increase the numerical aperture in the field planes step by step such that it was finally possible to achieve a numerical aperture of 0.9 in the second field plane 209.

In order to keep the aperture obscuration as low as possible, the mirrors in the second partial objective 205 are arranged geometrically in the vicinity of field planes in each case. The optical power of the concave mirror 249 is designed in such a way that the further intermediate image 243 is formed in the vicinity of the concave mirror 245. The axial distance between the mirror 249 and the paraxial position of the further intermediate image 243 is equal to the axial distance between the mirror 249 and the mirror 245, and is 60.6 mm.

In order to keep the aperture obscuration as low as possible, the concave mirrors 249 and 225 are arranged in the vicinity of the intermediate image 211, or of the further intermediate image 243. The axial distance between the concave mirror 249 and the intermediate image 211 is 50.0 mm, and likewise 50.0 mm between the concave mirror 225 and the further intermediate image 243. These axial distances also correspond in each case to the axial distances in relation to the mirror 213, or to the mirror 245. The axial distances are selected to be large enough to accommodate the adjacent mirrors 213 and 249, or 245 and 225, with an axial distance of the mirror rear surfaces, taking account of the respective substrate thickness. The substrate of mirror 245 does not have a plane rear surface. In order for the rays passing through the mirror aperture 247 not to be vignetted at the substrate, the rear surface has a frustoconical depression surrounding the central mirror aperture 247.

The mirror 221 is arranged close to the second field plane 209 and has an axial distance of 40.0 mm from this plane.

The mirror 221 has a diameter of 748.2 mm. Consequently, it should have a substrate thickness of 22.4 mm, at least on the optical axis OA. The substrate thickness of the mirror 221 on the optical axis is 34 mm. The difference between the substrate thickness and the axial distance of the mirror 221 from the second field plane 209 represents the free optical working distance, which is 6.0 mm in the second exemplary embodiment. On the other hand, the mirror 221 is arranged close enough to the second field plane 209 that the mirror obscuration is only 0.27 with a numerical aperture NA=0.9 in the second field plane 209.

The aperture plane 229 with the light blocking device 231 is located between the concave mirror 221 and the concave mirror 225. The marginal rays 237 and 239, which emanate from the two field points 233 and 235 in the first field plane 207, go through the upper and lower margins of the aperture plane 229. The field point 233 is located on the optical axis OA, and the field point 235 is located on the upper margin of the field at a distance of 100 mm from the optical axis OA. The aperture obscuration is 0.43 in the second exemplary embodiment. The ratio of the numerical aperture in the second field plane to the aperture obscuration is therefore 2.09. The mirror aperture 251 of the concave mirror 249 is the limiting factor for the aperture obscuration in the second exemplary embodiment.

It was possible in the second exemplary embodiment largely to correct the field curvature by means of the negative optical power of the convex mirror 213. The Petzval radius is 8940 mm.

It was possible in the second exemplary embodiment to correct the third-order spherical aberration to a value of 0.8 $\mu$m.

Figure 3A:
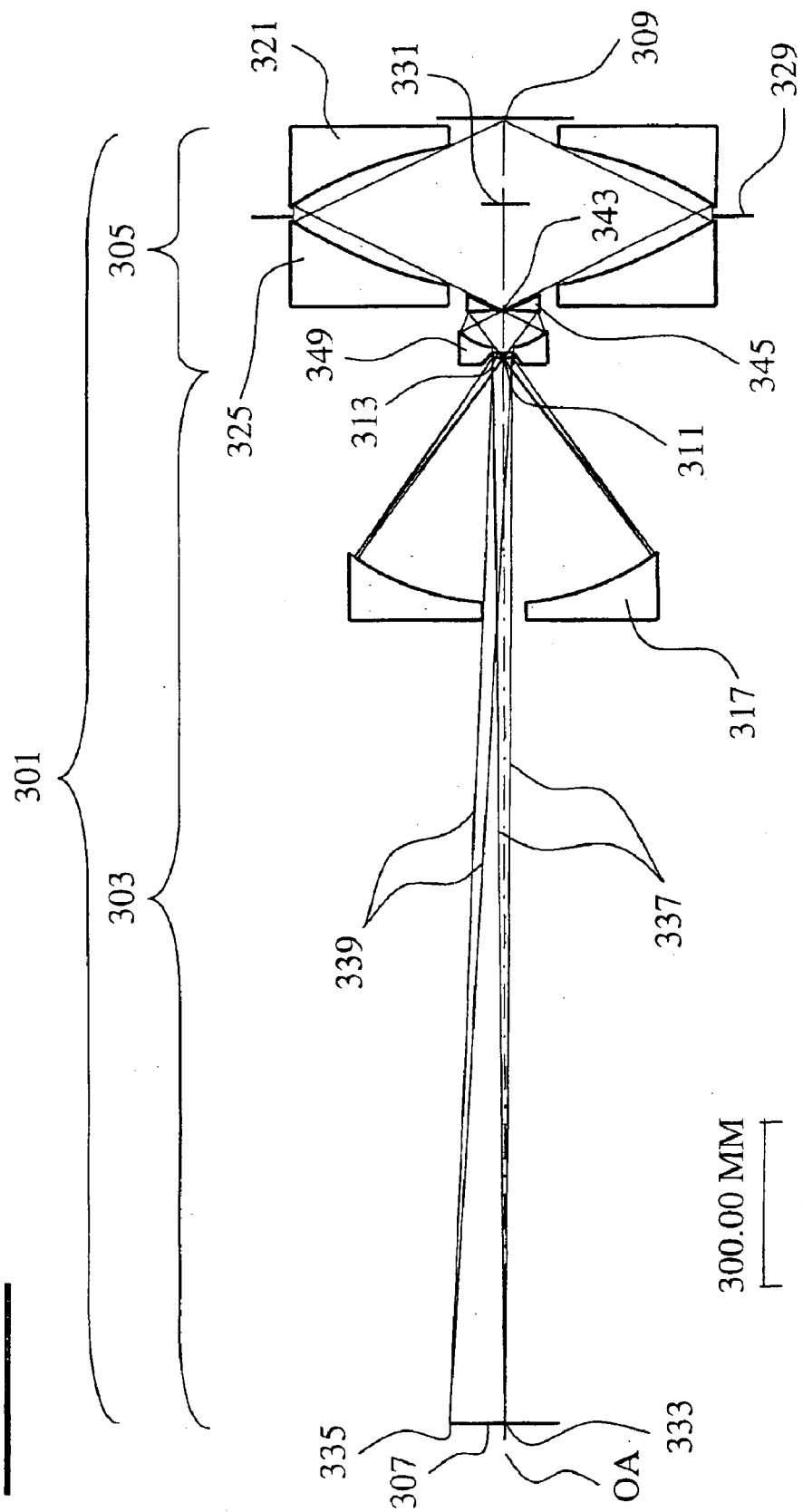
FIG. 3A represents a sectional view of a third exemplary embodiment of the invention.
Figure 3B:
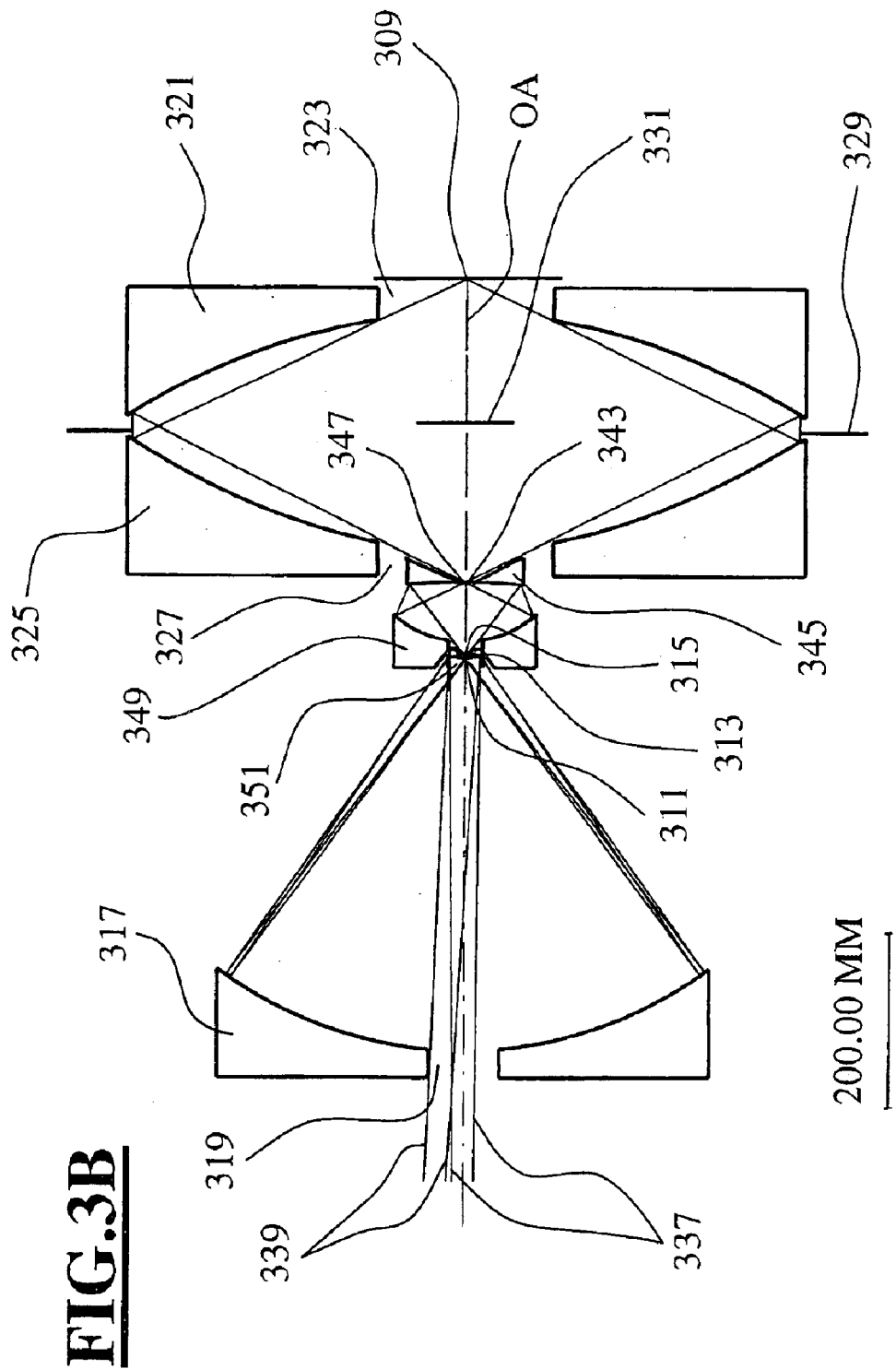
FIG. 3B represents an enlarged detail of FIG. 3A.

A third exemplary embodiment of an objective 301 in accordance with the invention is illustrated in FIG. 3A. FIG. 3B shows a detail from FIG. 3A for the purpose of better illustration. The optical data for the third exemplary embodiment are specified in Table 3 in the format of the optical design software CodeV. The elements in FIGS. 3A/B which correspond to the elements of FIGS. 2A/B have the same reference symbols as in FIGS. 2A/B increased by the number 100. Reference is made to the description relating to FIGS. 2A/B for a description of these elements.

The objective 301 comprises the first partial objective 303 and the second partial objective 305, which are centered on the optical axis OA. The objective 301 projects the first field plane 307 with an imaging ratio of 100:1 onto the second field plane 309. The numerical aperture NA in the second field plane 309 is 0.9. The diameter of the field in the second field plane 309 is 2 mm. The axial distance between the first field plane 307 and the second field plane 309 is 2389 mm.

The first partial objective 303 projects the first field plane 307 with an imaging ratio of 66:1 onto the intermediate image 311. It comprises the convex mirror 313 with the central mirror aperture 315, and the concave mirror 317 with the central mirror aperture 319. The concave mirror 317 is designed in such a way that the intermediate image 311 is formed in the vicinity of the convex mirror 313. The axial distance between the mirror 317 and the paraxial position of the intermediate image 311 is equal to the axial distance between the mirror 317 and the mirror 313 and is 450.8 mm. The ratio of the diameter of the concave mirror 317 to the diameter of the convex mirror 313 is 14.9:1. The free optical working distance between the first field plane 307 and the mirror 317 is 1470 mm, assuming a substrate thickness of 33.3 mm on the optical axis OA for the mirror 317.

The second partial objective 305 projects the intermediate image 311 onto the second field plane 309 with an imaging ratio of 1.5:1. The projection is performed via an intermediate projection of the intermediate image 311 onto the further intermediate image 343. The intermediate image 311 is projected by the concave mirror 345 with the central mirror aperture 347, and by the concave mirror 349 with the central mirror aperture 351, onto the further intermediate image 343 which is projected, in turn, by the concave mirror 321 with the central mirror aperture 323, and by the concave mirror 325 with the central mirror aperture 327, onto the second field plane 309.

The mirrors in the second partial objective 305 are respectively arranged in the vicinity of field planes. The optical power of the concave mirror 349 is designed in such a way that the further intermediate image 343 is formed in the vicinity of the concave mirror 345. The axial distance between the mirror 349 and the paraxial position of the further intermediate image 343 is equal to the axial distance between the mirror 349 and the mirror 345, and is 68.9 mm.

The concave mirrors 349 and 325 are arranged in the vicinity of the intermediate image 311, or of the further intermediate image 343. The axial distance between the concave mirror 349 and the intermediate image 311 is 18.9 mm, while that between the concave mirror 325 and the further intermediate image 343 is 37.5 mm. These axial distances also correspond in each case to the axial distances in relation to the mirror 313, or to the mirror 345. In the third exemplary embodiment, the axial distances between the mirrors 311 and 349, or between the mirrors 345 and 325, are smaller than the sum of the respective mirror substrates. Thus, by contrast with the second exemplary embodiment, the mirror 311 is located in the mirror aperture 351 of the mirror 349, and the mirror 345 is located in the mirror aperture 327 of the mirror 325. Whereas the mirror 349 determines the aperture obscuration in the second exemplary embodiment, the corresponding mirror 349 is no longer critical in the third exemplary embodiment. The substrate rear surfaces of the mirrors 313, 349 and 345 are not plane. In order that the rays passing through the mirror apertures are not vignetted on the mirror substrates, the rear surfaces have frustoconical depressions surrounding the central mirror apertures.

The mirror 321 is arranged close to the second field plane 309 and has an axial distance of 40.0 mm from this plane. The mirror 321 has a diameter of 760.7 mm. Consequently, it should have a substrate thickness of at least 22.8 mm on the optical axis OA. The substrate thickness of the mirror 321 on the optical axis is 35 mm. The difference between the substrate thickness and the axial distance of the mirror 321 from the second field plane 309 represents the free optical working distance, which is 5.0 mm in the third exemplary embodiment. On the other hand, the mirror 321 is arranged so close to the second field plane 309 that the mirror obscuration of the mirror 321 is only 0.26 in the case of a numerical aperture NA=0.9 in the second field plane 309.

The aperture plane 329 with the light blocking device 331 is located between the concave mirror 321 and the concave mirror 325. The marginal rays 337 and 339, which emanate from the two field points 333 and 335 in the first field plane 307, go through the upper and lower margins of the aperture plane 329. The field point 333 is located on the optical axis OA, and the field point 335 is located on the upper margin of the field at a distance of 100 mm from the optical axis OA. The aperture obscuration is 0.39 in the third exemplary embodiment. The ratio of the numerical aperture in the second field plane to the aperture obscuration is therefore 2.31. The mirror aperture 327 of the concave mirror 325 acts in a limiting fashion for the aperture obscuration in the third exemplary embodiment.

It was possible in the third exemplary embodiment largely to correct the field curvature by means of the negative optical power of the convex mirror 313. The Petzval radius is 76472 mm.

It was possible in the third exemplary embodiment to correct the spherical aberration of third order to a value of 0.3 $\mu$m.

Figure 4:
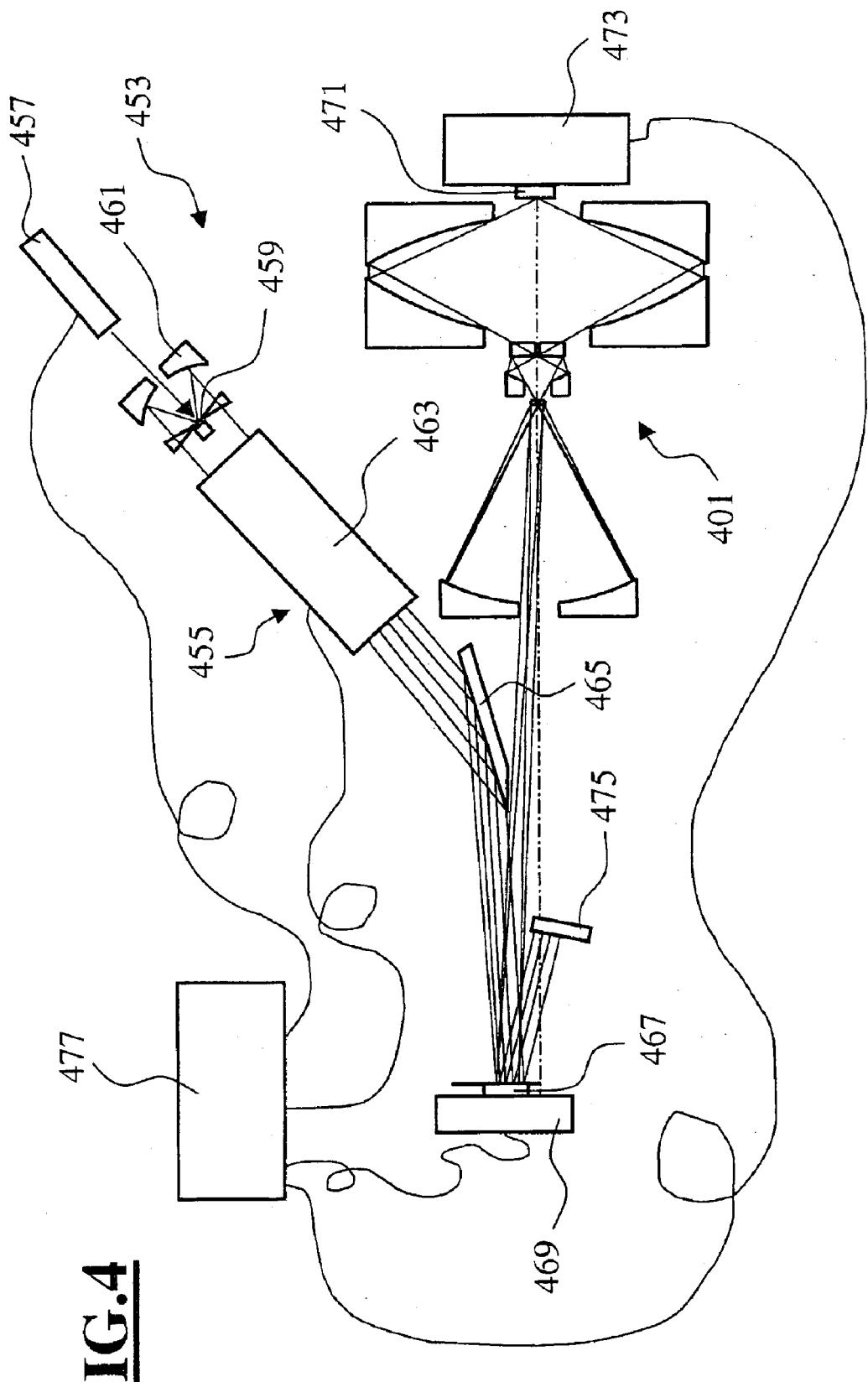
FIG. 4 schematically illustrates a lithographic projection apparatus with a controllable micromirror array.

A lithographic projection exposure apparatus 453 for EUV lithography is illustrated schematically in FIG. 4. A laser-induced plasma source 459 serves as light source. In this case, a Xenon target, for example, is excited by means of a pump laser 457 to emit EUV radiation. The illuminating system 455 comprises the collector mirror 461, the homogenizing and field-forming unit 463 and the field mirror 465. Such illuminating systems are described, for example, in U.S. Pat. No. 6,198,793 (DE 19903 807), which is owned by the same assignee as the present invention and whose content is incorporated herein by reference. The illuminating system 455 illuminates a restricted field on the micromirror array 467, which is arranged on the holding and positioning unit 469. The micromirror array 467 has 1000×1000 separately controllable mirrors of size 10 $\mu$m×10 $\mu$m. Taking account of a minimum distance of 0.5 $\mu$m between the micromirrors, the illuminating system 455 should illuminate a square field of size 10.5 mm×10.5 mm. The micromirror array 467 is located in the object plane of a projection objective 401, which projects the illuminated field onto a photosensitive substrate 471. The photosensitive substrate 471 is arranged on the holding and positioning unit 473, which also permits scanning of the micromirror array 467. One of the exemplary embodiments illustrated in FIGS. 1 to 3 can be used as projection objective 401. The micromirror array 467 is arranged in the first field plane, and the photosensitive substrate 471 in the second field plane. In order for the field mirror 465 not to vignette the projecting beam path, the field mirror 465 must be arranged at a sufficiently large distance from the micromirror array 467. On the other hand, this requires the illuminated field to be arranged not centered relative to the optical axis CA, but outside the optical axis. Since, however, the object fields of the exemplary embodiments shown have a diameter of 200 mm, the illuminated field can be arranged, for example, at a distance of 70 mm from the optical axis OA. The individual micromirrors of the micromirror array 467 are projected onto the photosensitive substrate 471 with an imaging ratio of 100:1, and so the images of the micromirrors have a size of 100 nm. Consequently, it is possible to produce structures with a resolution of approximately 100 nm on an image field of size 105 $\mu$m×105 $\mu$m, since the projection of the projection objective 401 is diffraction limited. By stepwise displacement and/or scanning of the photosensitive substrate 471 by means of the holding and positioning unit 473, it is also possible to expose fields with dimensions of several millimetres. The lithographic projection exposure apparatus 453 also has the ray trap 475. This absorbs the light rays of those ray pencils which are not aimed into the entrance pupil of the projection objective 401 by the micromirrors. The computer and control unit 477 is used to control the pump laser 457, the illuminating system 455, for the purpose of varying the pupil illumination, the controllable micromirror array 467 and the holding and positioning units 473 and 469.

Figure 5:
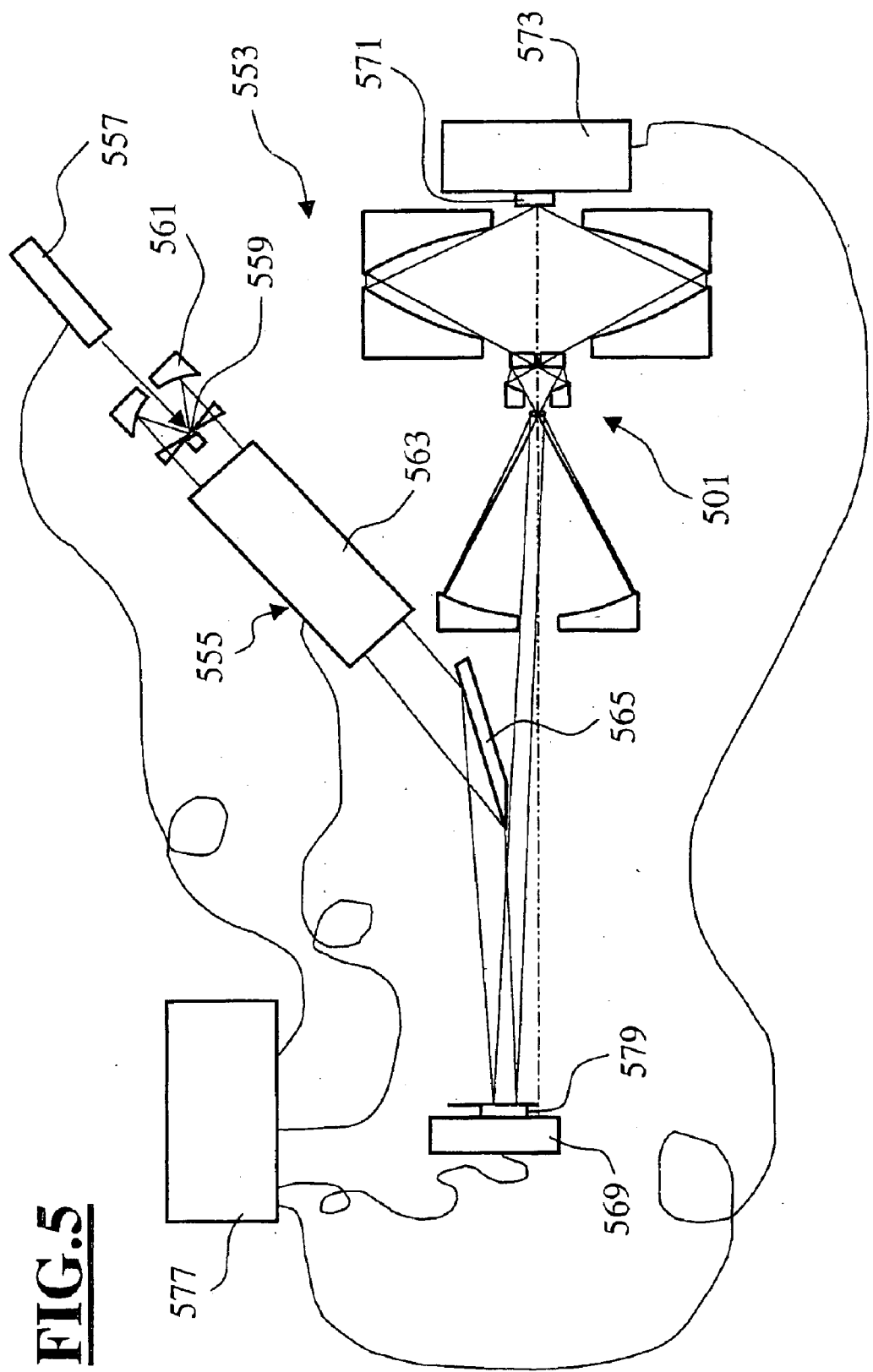
FIG. 5 schematically illustrates a lithographic projection apparatus with a structure-carrying mask.

A further exemplary embodiment of a lithographic projection exposure apparatus 553 is illustrated in FIG. 5. The lithographic projection exposure apparatus 553 has a reflective reticle 579 instead of the controllable micromirror array 467. The elements in FIG. 5 which correspond to the elements of FIG. 4 have the same reference numerals as in FIG. 4 increased by the number 100. Reference may be made to the description relating to FIG. 4 for a description of these elements. Since the structures on the reflective reticle 579 can have dimensions of less than 1 μm, it is possible to produce structures with resolutions of less than approximately 10 nm on the photosensitive substrate 571, since the projection of the projection objective 501 is diffraction limited.

Figure 6:
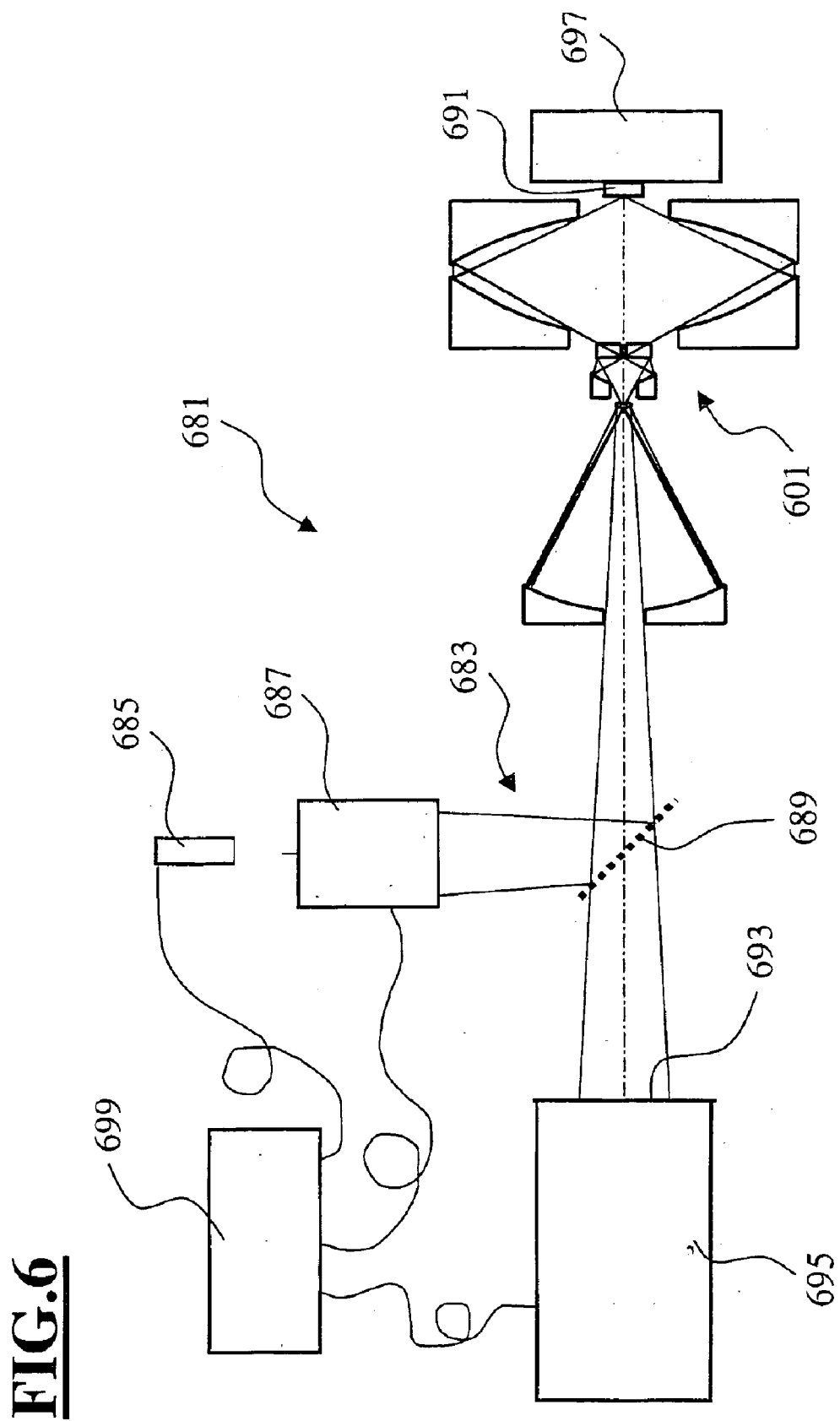
FIG. 6 schematically illustrates an inspection system.

An inspection system 681 for observing wafer surfaces is illustrated schematically in FIG. 6. An excimer laser 685 which produces light with a wavelength of 157 nm serves as light source. The illuminating system 683 comprises the homogenizing and field-forming unit 687 and the beam splitter 689, for example a semitransparent mirror. The beam splitter 689 couples the illuminating light into the inspection objective 601, which projects the surface of the object 691 to be analyzed onto the entry surface 693 of an observation unit 695. The object 691 is arranged on an object stage 697 which permits the displacement and rotation of the object 691. One of the exemplary embodiments illustrated in FIGS. 1 to 3 can be used as inspection objective 601. The object 691 is arranged in the second field plane, and the entry surface 693 in the first field plane. It is possible, for example, to use the inspection objective 601 to analyze a surface of 500 μm×500 μm. The image corresponding to this object field has dimensions of 50 mm×50 mm on the entry surface 693 of the observation unit 695. The computer and control unit 699 is used to control the light source 685, the illuminating system 687, for the purpose of varying the pupil illumination, and the object stage 697, and to evaluate the measured data from the observation unit 695. Using an inspection objective in accordance with the exemplary embodiments 1 to 3 has the advantage that it is possible by means of an appropriate coating of the mirrors to adapt the inspection objective to any wavelength, or to a wide wavelength range. In particular, the inspection objective can also be used at EUV wavelengths of less than 20 nm.

TABLE 1

Optical Data for Objective of FIG. 1A/1B

| Element | Curvature Radius | | | Aperture Diameter | | |
|---|---|---|---|---|---|---|
| (Ref. Symbol) | Front | Back | Thickness | Front | Back | Glass |
| Object | | inf. | 1684.0346 | | | |
| Mirror 1 (13) | | A(1) | −68.8152 | | C-1 | reflecting |
| Mirror 2 (17) | | A(2) | 344.7808 | | C-2 | reflecting |
| Mirror 3 (21) | | A(3) | −62.6453 | | C-3 | reflecting |
| | | | APERTURE STOP | | 338.9074 | |
| | | | −142.0994 | | | |
| Mirror 4 (25) | | A(4) | 204.7447 | | C-4 | reflecting |
| | | | | | 80.2169 | |
| Image | Image Distance = inf. | | 39.9998 | | 2.0029 | |

APERTURE DATA

| Aperture | Shape | | Diameter | | Decenter | | Rotation |
|---|---|---|---|---|---|---|---|
| | | | X | Y | X | Y | |
| C-1 | Circle | (obsc.) | 25.069 | | | | |
| | Circle | | 6.000 | 6.000 | | | |
| C-2 | Circle | (obsc.) | 76.190 | | | | |
| | Circle | | 34.000 | 34.000 | | | |
| C-3 | Circle | (obsc.) | 315.840 | | | | |
| | Circle | | 90.000 | 90.000 | | | |
| C-4 | Circle | (obsc.) | 388.014 | | | | |
| | Circle | | 100.000 | 100.000 | | | |

Aspheric Constants $$Z = \frac{(\text{curv})Y^2}{1 + [1(1+K)(\text{curv})^2 Y^2]^{\frac{1}{2}}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| aspheric | curv | K<br>E | A<br>F | B<br>G | C<br>H | D<br>J |
|---|---|---|---|---|---|---|
| A(1) | 0.01632142 | 0.721125<br>5.01736E−33 | −1.13241E−06<br>2.59205E−34 | −7.44173E−10<br>0.00000E+00 | −1.20959E−13<br>0.00000E+00 | 1.82841E−16<br>0.00000E+00 |
| A(2) | 0.01249319 | 0.374720−<br>7.61820E−23 | −1.34649E−07<br>−4.74274E−26 | −2.20696E−11<br>0.00000E+00 | −3.87070E−15<br>0.00000E+00 | −5.51394E−19<br>0.00000E+00 |
| A(3) | −0.00163228 | −8.138119−<br>8.43173E−29 | 3.08966E−10<br>2.01064E−33 | 8.83050E−14<br>0.00000E+00 | 1.52159E−20<br>0.00000E+00 | 1.03323E−23<br>0.00000E+00 |
| A(4) | 0.00220115 | 1.243485<br>6.74937E−30 | 4.66665E−10<br>−3.83976E−35 | −4.05558E−15<br>0.00000E+00 | 4.03013E−20<br>0.00000E+00 | −5.94690E−25<br>0.00000E+00 |

AT USED CONJUGATES:

| REDUCTION = | OBJECT DIST = | TOTAL TRACK = | IMAGE DIST = | OAL = |
|---|---|---|---|---|
| −0.0100 | 1684.0346 | 2000.0000 | 39.9998 | 275.9656 |

TABLE 2

Optical Data for Objective of FIG. 2A/2B

| Element | Curvature Radius | | | Aperture Diameter | | |
|---|---|---|---|---|---|---|
| (Ref. Symbol) | Front | Back | Thickness | Front | Back | Glass |
| Object | inf. | | 1533.8845 | | | |
| Mirror 1 (213) | A(1) | | −447.4711 | C-1 | | reflecting |
| Mirror 2 (217) | A(2) | | 558.0315 | C-2 | | reflecting |
| Mirror 3 (245) | A(3) | | −60.5605 | C-3 | | reflecting |
| Mirror 4 (249) | A(4) | | 376.0924 | C-4 | | reflecting |
| Mirror 5 (221) | A(5) | | −130.5321 | C-5 | | reflecting |
| | | | APERTURE STOP −135.0000 | 748.0479 | | |
| Mirror 6 (225) | A(6) | | 265.5321 | C-6 166.8325 | | reflecting |
| Image | Image Distance = inf. | | 40.0232 | 2.0046 | | |

APERTURE DATA

| Aperture | Shape | | Diameter | | Decenter | | Rotation |
|---|---|---|---|---|---|---|---|
| | | | X | Y | X | Y | |
| C-1 | Circle | (obsc.) | 29.950 | | | | |
| | Circle | | 6.000 | 6.000 | | | |
| C-2 | Circle | (obsc.) | 432.760 | | | | |
| | Circle | | 90.000 | 90.000 | | | |
| C-3 | Circle | (obsc.) | 115.248 | | | | |
| | Circle | | 10.000 | 10.000 | | | |
| C-4 | Circle | (obsc.) | 136.401 | | | | |
| | Circle | | 60.000 | 60.000 | | | |
| C-5 | Circle | (obsc.) | 748.249 | | | | |
| | Circle | | 200.000 | 200.000 | | | |
| C-6 | Circle | (obsc.) | 748.006 | | | | |
| | Circle | | 240.000 | 240.000 | | | |

Aspheric Constants

| aspheric | curv | K | A | B | C | D |
|---|---|---|---|---|---|---|
| A(1) | 0.01462135 | 4.236799 | 0.00000E+00 | −2.34672E−10 | 2.25315E−13 | 0.00000E+00 |
| A(2) | 0.00215389 | 0.031898 | 0.00000E+00 | 1.71983E−16 | 4.27637E−21 | 0.00000E+00 |
| A(3) | −0.00076244 | 381.118675 | 0.00000E+00 | −2.25582E−12 | −7.14313E−16 | 0.00000E+00 |
| A(4) | 0.00849256 | 0.414914 | 0.00000E+00 | 1.39628E−13 | −3.22627E−17 | 0.00000E+00 |
| A(5) | −0.00146641 | −0.715112 | 0.00000E+00 | −2.04954E−16 | −6.04643E−22 | 0.00000E+00 |
| A(6) | 0.00185791 | −1.171636 | 0.00000E+00 | −1.34911E−15 | 1.97533E−21 | 0.00000E+00 |

AT USED CONJUGATES:

| REDUCTION = 0.0100 | OBJECT DIST = 1533.8845 | TOTAL TRACK = 2000.0000 | IMAGE DIST = 40.0232 | OAL = 426.0923 |
|---|---|---|---|---|

TABLE 3

Optical Data for Objective of FIG. 3A/3B

| Element | Curvature Radius | | | Aperture Diameter | | |
|---|---|---|---|---|---|---|
| (Ref. Symbol) | Front | Back | Thickness | Front | Back | Glass |
| Object | inf. | | 1954.1364 | | | |
| Mirror 1 (313) | A(1) | | −450.8028 | C-1 | | reflecting |
| Mirror 2 (317) | A(2) | | 538.6037 | C-2 | | reflecting |
| Mirror 3 (345) | A(3) | | −68.8878 | C-3 | | reflecting |
| Mirror 4 (349) | A(4) | | 375.9476 | C-4 | | reflecting |
| Mirror 5 (321) | A(5) | | −134.5548 | C-5 | | reflecting |
| | | | APERTURE STOP −135.0000 | 759.6775 | | |
| Mirror 6 (325) | A(6) | | 269.5548 | C-6 166.7569 | | reflecting |
| Image | Image Distance = inf. | | 40.0005 | 2.0027 | | |

TABLE 3-continued

Optical Data for Objective of FIG. 3A/3B

|  |  |  | Diameter | | Decenter | | |
| --- | --- | --- | --- | --- | --- | --- | --- |
| Aperture | Shape |  | X | Y | X | Y | Rotation |
| C-1 | Circle | (obsc.) | 36.788 | | | | |
|  | Circle |  | 4.000 | 4.000 | | | |
| C-2 | Circle | (obsc.) | 550.616 | | | | |
|  | Circle |  | 80.000 | 80.000 | | | |
| C-3 | Circle | (obsc.) | 126.324 | | | | |
|  | Circle |  | 4.000 | 4.000 | | | |
| C-4 | Circle | (obsc.) | 156.779 | | | | |
|  | Circle |  | 40.000 | 40.000 | | | |
| C-5 | Circle | (obsc.) | 760.748 | | | | |
|  | Circle |  | 200.000 | 200.000 | | | |
| C-6 | Circle | (obsc.) | 759.241 | | | | |
|  | Circle |  | 200.000 | 200.000 | | | |

Aspheric Constants

| aspheric | curv | K/E | A/F | B/G | C/H | D/J |
| --- | --- | --- | --- | --- | --- | --- |
| A(1) | 0.01453296 | 3.993966 | −1.25979E−07 | −2.40984E−10 | −2.22973E−13 | −1.92806E−16 |
|  | 0.00000E+00 | 0.00000E+00 | 0.00000E+00 | 0.00000E+00 | 0.00000E+00 | 0.00000E+00 |
| A(2) | 0.00214496 | −0.072178 | 9.97447E−11 | 5.58371E−16 | 2.94983E−21 | 2.11781E−27 |
|  |  | 1.14313E−31 | 1.09251E−37 | 0.00000E+00 | 0.00000E+00 | 0.00000E+00 |
| A(3) | −0.00095338 | 177.846664 | −4.27020E−08 | 3.95468E−12 | 3.32517E−20 | −6.96347E−20 |
|  |  | 1.24958E−24 | 9.52941E−28 | 0.00000E+00 | 0.00000E+00 | 0.00000E+00 |
| A(4) | 0.00808626 | 0.279920 | 5.46076E−09 | 3.59983E−13 | 5.29416E−18 | −6.95655E−23 |
|  |  | 1.93949E−25 | 2.44723E−30 | 0.00000E+00 | 0.00000E+00 | 0.00000E+00 |
| A(5) | −0.00151095 | −0.696060 | 0.00000E+00 | −3.66210E−16 | −3.54668E−22 | −1.33788E−27 |
|  |  | −2.47308E−33 | −1.25578E−38 | 0.00000E+00 | 0.00000E+00 | 0.00000E+00 |
| A(6) | 0.00185048 | −1.256318 | −1.93114E−11 | −1.38066E−15 | 2.59583E−21 | −5.18058E−27 |
|  |  | 7.48520E−33 | 6.54710E−39 | 0.00000E+00 | 0.00000E+00 | 0.00000E+00 |

AT USED CONJUGATES:

| REDUCTION = 0.0100 | OBJECT DIST = 1954.1364 | TOTAL TRACK = 2388.9976 | IMAGE DIST = 40.0005 | OAL = 394.8606 |
| --- | --- | --- | --- | --- |

What is claimed is:

1. An objective having a first field plane, an intermediate image plane, and a second field plane, the objective comprising a first partial objective having a first, convex mirror with a first central mirror aperture and a second, concave mirror with a second central mirror aperture; and a second partial objective having a third, concave mirror with a third central mirror aperture and a fourth, concave mirror with a fourth central mirror aperture;

wherein the first field plane and the intermediate image plane are conjugate planes relative to the first partial objective, and the intermediate image plane and the second field plane are conjugate planes relative to the second partial objective, wherein the first mirror has a first axial distance from the second mirror, the second mirror has a second axial distance from the intermediate image, and said first and second axial distances have a ratio between 0.95 and 1.05 relative to each other; wherein the third mirror has a third axial distance $Z_{M3-IM}$ from the second field plane, and said third axial distance conforms to the relationship $$0.03 \cdot Du_{M3} + 5.0 \text{ mm} < Z_{M3-IM} < \frac{0.25 \cdot Du_{M3}}{\tan(\arcsin(NA))},$$

NA representing a numerical aperture NA in the second field plane, and $Du_{M3}$ representing a diameter of the third mirror;

and wherein further the second field plane has a fourth axial distance from the first field plane, and the objective has a Petzval radius whose absolute value is greater than said fourth axial distance.

2. The objective of claim 1, wherein light rays that are not vignetted by said first, second, third and fourth central mirror apertures define a minimum aperture angle in the second field plane, wherein an aperture obscuration is defined as the ratio between the sine of said minimum aperture angle and said numerical aperture NA, and wherein the aperture obscuration has a value of less than 0.6.

3. The objective of claim 2, wherein the ratio of the numerical aperture NA to the aperture obscuration is greater than 1.2.

4. The objective of claim 1, wherein the numerical aperture NA is greater than 0.3.

5. The objective of claim 1, wherein the objective has an overall imaging ratio greater than 4:1 between the first field plane and the second field plane.

6. The objective of claim 1, wherein the objective has a first imaging ratio greater than 1:1 between the first field plane and the intermediate image, and a second imaging ratio greater than 1:1 between the intermediate image and the second field plane.

7. The objective of claim 1, wherein the objective has a first imaging ratio greater than 3:1 between the first field plane and the intermediate image.

8. The objective of claim 1, wherein the first mirror has a first diameter and the second mirror has a second diameter, and wherein said second diameter has a ratio greater than 3:1 to said first diameter.

9. The objective of claim 1, wherein the fourth mirror has a fifth axial distance from the first mirror, and wherein said fifth axial distance is less than 10 percent of the fourth axial distance.

10. The objective of claim 1, wherein the objective consists of the first, second, third and fourth mirrors.

11. The objective of claim 1, further comprising a fifth mirror with a fifth central mirror aperture and a sixth mirror with a sixth central mirror aperture, wherein the sixth mirror follows the fifth mirror in a light path between the intermediate image and the third mirror, and wherein a further intermediate image is formed in said light path between the sixth mirror and the third mirror.

12. The objective of claim 11, wherein the fifth and sixth mirrors are concave mirrors.

13. The objective of claim 11, wherein the fifth mirror has a sixth axial distance from the further intermediate image, and wherein said sixth axial distance is less than 5 percent of the fourth axial distance.

14. The objective of claim 11, wherein the sixth mirror has a seventh axial distance from the first mirror, and wherein said seventh axial distance is less than 10 percent of the fourth axial distance.

15. The objective of claim 11, wherein the fifth mirror has an eighth axial distance from the fourth mirror, and wherein said eighth axial distance is less than 10 percent of the fourth axial distance.

16. The objective of claim 11, wherein the objective consists of the first, second, third, fourth, fifth and sixth mirrors.

17. The objective of claim 1, wherein the objective has a free working distance $FWD_{Obj}$ between the first field plane and the first partial objective, said free working distance $FWD_{Obj}$ being greater than 20 percent of the fourth axial distance.

18. The objective of claim 1, wherein aberrations are corrected in the second field plane within a field of more than 1.0 mm diameter.

19. The objective of claim 1, wherein the objective has a spherical aberration in the second field plane, and wherein said spherical aberration has a ratio of less than $10^{-5}$ to the fourth axial distance.

20. The objective of claim 1, wherein the fourth axial distance is at most 3000 millimeters.

21. The objective of claim 1, wherein the objective projects a reduced image of an object in the first field plane into the second field plane.

22. A lithographic projection apparatus comprising an illumination system and the objective of claim 21, wherein the object is a mask carrying a microstructure and wherein a photosensitive substrate is arranged in the second field plane to receive said reduced image.

23. A method of exposing photosensitive substrates in the lithographic projection apparatus of claim 22, wherein the method comprises:
illuminating the mask by means of the illumination system with a ray pencil,
modulating the ray pencil by means of the mask, and
projecting the modulated ray pencil onto the photosensitive substrate by means of the objective.

24. A lithographic projection apparatus comprising an illumination system and the objective of claim 21, wherein the object is a controllable array of micromirrors and wherein a photosensitive substrate is arranged in the second field plane to receive said reduced image.

25. A method of exposing photosensitive substrates in the lithographic projection apparatus of claim 24, wherein the method comprises:

illuminating the controllable micromirror array by means of the illumination system,
reflecting ray pencils from the micromirrors,
by means of a control unit, driving the micromirrors in accordance with a prescribed pattern having the effect that only a part of the reflected ray pencils will fall on the photosensitive substrate through the objective, and
projecting the reflected ray pencils onto the photosensitive substrate by means of the objective.

26. The objective of claim 1, wherein the objective projects an enlarged image of an object in the second field plane into the first field plane.

27. An inspection system, comprising the objective of claim 26, an illumination system, and an observation unit with an entry surface, wherein said entry surface is located in the first field plane to receive said enlarged image projected by the objective.

28. A method of inspecting an object by means of the inspection system of claim 27, wherein the object to be inspected has a surface area carrying structures, the method comprising the steps:
illuminating said surface area by means of the illumination system with a ray pencil, with the result that rays of the ray pencil are diffracted in different directions by said structures,
projecting the diffracted rays onto the entry surface of the observation unit.

29. An objective having a first field plane, an intermediate image plane and a second field plane, the objective comprising
a first partial objective having a first mirror with a first central mirror aperture and a second mirror with a second central mirror aperture; and
a second partial objective having a third mirror with a third central mirror aperture and a fourth mirror with a fourth central mirror aperture;
wherein the first field plane and the intermediate image plane are conjugate planes relative to the first partial objective;
wherein the intermediate image plane and the second field plane are conjugate planes relative to the second partial objective;
wherein the objective has a first imaging ratio greater than 1:1 between the first field plane and the intermediate image, and a second imaging ratio greater than 1:1 between the intermediate image and the second field plane.

30. The objective of claim 29, wherein the objective has a first imaging ratio greater than 3:1 between the first field plane and the intermediate image.

31. The objective of claim 29, wherein the first mirror has a first diameter and the second mirror has a second diameter, and wherein said second diameter has a ratio greater than 3:1 to said first diameter.

32. The objective of claim 29, wherein the objective has an overall imaging ratio greater than 4:1 between the first field plane and the second field plane.

33. The objective of claim 29, wherein light rays that are not vignetted by said first, second, third and fourth central mirror apertures define a minimum aperture angle in the second field plane, wherein an aperture obscuration is defined as the ratio between the sine of said minimum aperture angle and said numerical aperture NA, and wherein the aperture obscuration has a value of less than 0.6.

34. The objective of claim 33, wherein the ratio of the numerical aperture NA to the aperture obscuration is greater than 1.2.

35. The objective of claim 29, wherein the numerical aperture NA is greater than 0.3.

36. The objective of claim 29, wherein the first mirror is a convex mirror, the second mirror is a concave mirror, the third mirror is a concave mirror, and the fourth mirror is a concave mirror.

37. An objective having a first field plane, a first intermediate image plane, a second intermediate image plane, and a second field plane, the objective comprising a first partial objective having a first mirror with a first central mirror aperture and a second mirror with a second central mirror aperture;

a second partial objective having a third mirror with a third central mirror aperture and a fourth mirror with a fourth central mirror aperture; and a third partial objective having a fifth mirror with a fifth central mirror aperture and a sixth mirror with a sixth central mirror aperture wherein the first field plane and the first intermediate image plane are conjugate planes relative to the first partial objective;

wherein the first intermediate image plane and the second intermediate image plane are conjugate planes relative to the second partial objective;

wherein the second intermediate image plane and the second field plane are conjugate planes relative to the third partial objective; and wherein the objective produces a diffraction-limited projection.

38. The objective of claim 37, wherein the objective has a first imaging ratio greater than 1:1 between the first field plane and the first intermediate image, and a second imaging ratio greater than 1:1 between the first intermediate image and the second field plane.

39. The objective of claim 37, wherein the objective has a first imaging ratio greater than 3:1 between the first field plane and the first intermediate image.

40. The objective of claim 37, wherein the objective has an overall imaging ratio greater than 4:1 between the first field plane and the second field plane.

41. The objective of claim 37, wherein the numerical aperture NA is greater than 0.3.

42. The objective of claim 37, wherein the first mirror is a convex mirror, the second mirror is a concave mirror, the third mirror is a concave mirror, the fourth mirror is a concave mirror, the fifth mirror is a concave mirror and the sixth mirror is a concave mirror.

43. The objective of claim 37, wherein the first mirror is a convex mirror, the second mirror is a concave mirror, the third mirror is a concave mirror, the fourth mirror is a concave mirror, the fifth mirror is a convex mirror and the sixth mirror is a concave mirror.

44. An objective having a first field plane, a first intermediate image plane, a second intermediate image plane, and a second field plane, the objective comprising a first partial objective having a first mirror with a first central mirror aperture and a second mirror with a second central mirror aperture;

a second partial objective having a third mirror with a third central mirror aperture and a fourth mirror with a fourth central mirror aperture; and a third partial objective having a fifth mirror with a fifth central mirror aperture and a sixth mirror with a sixth central mirror aperture wherein the first field plane and the first intermediate image plane are conjugate planes relative to the first partial objective;

wherein the first intermediate image plane and the second intermediate image plane are conjugate planes relative to the second partial objective;

wherein the second intermediate image plane and the second field plane are conjugate planes relative to the third partial objective, and wherein the objective has a first imaging ratio greater than 1:1 between the first field plane and the first intermediate image, and a second imaging ratio greater than 1:1 between the first intermediate image and the second field plane.

45. The objective of claim 44, wherein the objective has a first imaging ratio greater than 3:1 between the first field plane and the first intermediate image.

46. The objective of claim 44, wherein the objective has an overall imaging ratio greater than 4:1 between the first field plane and the second field plane.

47. An objective having a first field plane, a first intermediate image plane, a second intermediate image plane, and a second field plane, the objective comprising a first partial objective having a first mirror with a first central mirror aperture and a second mirror with a second central mirror aperture;

a second partial objective having a third mirror with a third central mirror aperture and a fourth mirror with a fourth central mirror aperture; and a third partial objective having a fifth mirror with a fifth central mirror aperture and a sixth mirror with a sixth central mirror aperture wherein the first field plane and the first intermediate image plane are conjugate planes relative to the first partial objective;

wherein the first intermediate image plane and the second intermediate image plane are conjugate planes relative to the second partial objective;

wherein the second intermediate image plane and the second field plane are conjugate planes relative to the third partial objective, and wherein the objective has an overall imaging ratio greater than 4:1 between the first field plane and the second field plane.

* * * * *